United States Patent
Bloom et al.

(10) Patent No.: US 7,098,107 B2
(45) Date of Patent: Aug. 29, 2006

(54) PROTECTIVE LAYER IN MEMORY DEVICE AND METHOD THEREFOR

(75) Inventors: Ilan Bloom, Haifa (IL); Boaz Ettan, Ra'anana (IL)

(73) Assignee: Saifun Semiconductor Ltd., Netanya (IL)

( * ) Notice: Subject to any disclaimer, the term of this patent is extended or adjusted under 35 U.S.C. 154(b) by 234 days.

(21) Appl. No.: 09/988,122

(22) Filed: Nov. 19, 2001

(65) Prior Publication Data

US 2003/0096475 A1    May 22, 2003

(51) Int. Cl.
*H01L 21/336*  (2006.01)

(52) U.S. Cl. ...................... 438/261; 438/954

(58) Field of Classification Search ........ 438/257–267, 438/954
See application file for complete search history.

(56) References Cited

U.S. PATENT DOCUMENTS

| | | | |
|---|---|---|---|
| 3,895,360 A | 7/1975 | Cricchi et al. | |
| 4,016,588 A | 4/1977 | Ohya et al. | |
| 4,017,888 A | 4/1977 | Christie et al. | |
| 4,151,021 A | 4/1979 | McElroy | |
| 4,173,766 A | 11/1979 | Hayes | |
| 4,173,791 A | 11/1979 | Bell | |
| 4,257,832 A | 3/1981 | Schwabe et al. | |
| 4,306,353 A | 12/1981 | Jacobs et al. | |
| 4,342,149 A | 8/1982 | Jacobs et al. | |
| 4,360,900 A | 11/1982 | Bate | |
| 4,380,057 A | 4/1983 | Kotecha et al. | |
| 4,471,373 A | 9/1984 | Shimizu et al. | |
| 4,521,796 A | 6/1985 | Rajkanan et al. | |
| 4,527,257 A | 7/1985 | Cricchi | |
| 4,630,085 A | 12/1986 | Koyama | |
| 4,665,426 A | * 5/1987 | Allen et al. | 257/323 |
| 4,667,217 A | 5/1987 | Janning | |
| 4,742,491 A | 5/1988 | Liang et al. | |
| 4,758,869 A | * 7/1988 | Eitan et al. | 257/323 |
| 4,769,340 A | 9/1988 | Chang et al. | |
| 4,780,424 A | 10/1988 | Holler et al. | |
| 4,847,808 A | 7/1989 | Kobatake | |
| 4,870,470 A | 9/1989 | Bass, Jr. et al. | |
| 4,941,028 A | 7/1990 | Chen et al. | |
| 4,992,391 A | * 2/1991 | Wang | 438/257 |
| 5,021,999 A | 6/1991 | Kohda et al. | |
| 5,075,245 A | 12/1991 | Woo et al. | |
| 5,104,819 A | 4/1992 | Freiberger et al. | |
| 5,120,672 A | * 6/1992 | Mitchell et al. | 438/261 |
| 5,159,570 A | 10/1992 | Mitchell et al. | |
| 5,168,334 A | 12/1992 | Mitchell et al. | |
| 5,175,120 A | 12/1992 | Lee | |
| 5,214,303 A | 5/1993 | Aoki | |

(Continued)

FOREIGN PATENT DOCUMENTS

EP          0751560          1/1997

(Continued)

OTHER PUBLICATIONS

U.S. Appl. No. 08/902,890, filed Jul. 30, 1997, Eitan.

(Continued)

*Primary Examiner*—Richard A. Booth
(74) *Attorney, Agent, or Firm*—Eitan Law Group

(57) ABSTRACT

A method for protecting a non-volatile memory device, the method including forming a non-volatile memory device including a polycide structure formed over a non-conducting charge trapping layer, and forming a protective layer over at least a portion of the polycide structure, the protective layer being adapted to absorb electromagnetic wave energy having a wavelength shorter than visible light. A device constructed in accordance with the method is also disclosed.

15 Claims, 2 Drawing Sheets

U.S. PATENT DOCUMENTS

| | | |
|---|---|---|
| 5,305,262 A | 4/1994 | Yoneda |
| 5,311,049 A | 5/1994 | Tsuruta |
| 5,324,675 A | 6/1994 | Hayabuchi |
| 5,334,555 A * | 8/1994 | Sugiyama et al. .......... 438/792 |
| 5,338,954 A | 8/1994 | Shimoji |
| 5,349,221 A | 9/1994 | Shimoji |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,426,605 A | 6/1995 | Van Berkel et al. |
| 5,434,825 A | 7/1995 | Harari |
| 5,436,481 A | 7/1995 | Egawa et al. |
| 5,455,793 A | 10/1995 | Amin et al. |
| 5,467,308 A | 11/1995 | Chang et al. |
| 5,477,499 A | 12/1995 | Van Buskirk et al. |
| 5,496,753 A | 3/1996 | Sakurai et al. |
| 5,518,942 A | 5/1996 | Shrivastava |
| 5,523,251 A | 6/1996 | Hong |
| 5,553,018 A | 9/1996 | Wang et al. |
| 5,599,727 A | 2/1997 | Hakozaki et al. |
| 5,654,568 A | 8/1997 | Nakao |
| 5,656,513 A | 8/1997 | Wang et al. |
| 5,712,814 A | 1/1998 | Fratin et al. |
| 5,726,946 A | 3/1998 | Yamagata et al. |
| 5,760,445 A | 6/1998 | Diaz |
| 5,768,192 A | 6/1998 | Eitan |
| 5,787,036 A | 7/1998 | Okazawa |
| 5,793,079 A | 8/1998 | Georgescu et al. |
| 5,801,076 A | 9/1998 | Ghneim et al. |
| 5,812,449 A | 9/1998 | Song |
| 5,825,686 A | 10/1998 | Schmitt-Landsiedel et al. |
| 5,836,772 A | 11/1998 | Chang et al. |
| 5,841,700 A | 11/1998 | Chang |
| 5,847,441 A | 12/1998 | Cutter et al. |
| 5,864,164 A | 1/1999 | Wen |
| 5,870,335 A | 2/1999 | Khan et al. |
| 5,903,031 A | 5/1999 | Yamada et al. |
| 5,946,558 A | 8/1999 | Hsu |
| 5,963,412 A | 10/1999 | En |
| 5,973,373 A | 10/1999 | Krautschneider et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,063,666 A | 5/2000 | Chang et al. |
| 6,156,149 A * | 12/2000 | Cheung et al. .......... 156/272.2 |
| 6,195,196 B1 * | 2/2001 | Kimura et al. .............. 359/295 |
| 6,201,282 B1 | 3/2001 | Eitan |
| 6,337,502 B1 | 1/2002 | Eitan et al. |

FOREIGN PATENT DOCUMENTS

| | | |
|---|---|---|
| EP | 1073120 | 1/2001 |
| GB | 1297899 | 11/1972 |
| GB | 2157489 | 10/1985 |
| JP | 05021758 | 1/1993 |
| JP | 07193151 | 7/1995 |
| JP | 09162314 | 6/1997 |
| WO | WO 81/00790 | 3/1981 |
| WO | WO 96/25741 | 8/1996 |

OTHER PUBLICATIONS

U.S. Appl. No. 08/905,286, filed Jul. 30, 1997, Eitan.

U.S. Appl. No. 09/348,720, filed Jul. 6, 1999, Eitan.

U.S. Appl. No. 09/413,408, filed Oct. 6, 1999, Eitan.

U.S. Appl. No. 09/536,125, filed Mar. 28, 2000, Eitan et al.

Chan et al., "A True Single-Transistor Oxide-Nitride-Oxide EEPROM Device," *IEEE Electron Device Letters*, vol. EDL-8, No. 3, Mar. 1987.

Chang, J., "Non Volatile Semiconductor Memory Devices," *Proceedings of the IEEE*, vol. 64 No. 7, pp. 1039-1059, Jul. 1976.

Eitan et al., "Hot-Electron Injection into the Oxide in n-Channel MOS Devices," *IEEE Transactions on Electron Devices*, vol. ED-28, No. 3, pp. 328-340, Mar. 1981.

Glasser et al., "The Design and Analysis of VLSI Circuits," Addison Wesley Publishing Co, Chapter 2, 1988.

Lee, H., "A New Approach For the Floating-Gate MOS NonVolatile Memory", *Applied Physics Letters*, vol. 31, No. 7, pp. 475-476, Oct. 1977.

Ma et al., "A dual-bit Split-Gate EEPROM (DSG) Cell in Contactless Array for Single-Vcc High Density Flash Memories," IEEE, pp. 3.5.1-3.5.4, 1994.

Ohshima et al., "Process and Device Technologies for 16Mbit Eproms with Large—Tilt—Angle implanted P-Pocket Cell," *IEEE*, CH2865-4/90/0000-0095, pp. 5.2.1-5.2.4, Dec. 1990.

Ricco, Bruno et al., "Nonvolatile Multilevel Memories for Digital Application," *IEEE*, vol. 86, No. 12, pp. 2399-2421, Dec. 1998.

Roy, Anirban "Characterization and Modeling of Charge Trapping and Retention in Novel Multi-Dielectric Nonvolatile Semiconductor Memory Devices," Doctoral Dissertation, Sherman Fairchild Center, Department of Computer Science and Electrical Engineering, pp. 1-35, 1989.

"2 Bit/Cell EEPROM Cell Using Band-To-Band Tunneling For Data Read-Out," *IBM Technical Disclosure Bulletin*, U.S. IBM Corp. NY vol. 35, No. 4B, ISSN:0018-8689, Sep. 1992.

Tseng, Hsing-Huang et al., "Thin CVD Stacked Gate Dielectric for ULSI Technology", *IEEE*, 0-7803-1450-6, 1993.

Pickar, K.A., "Ion Implantation in Silicon," *Applied Solid State Science*, vol. 5, R. Wolfe Edition, Academic Press, New York, 1975.

Bhattacharyya et al., "FET Gate Structure for Nonvolatile N-Channel Read-Mostly Memory Device," *IBM Technical Disclosure Bulletin*, U.S. IBM Corp. vol. 18, No. 6, p. 1768, Nov. 1975.

Bude et al., "EEPROM/Flash Sub 3.0 V Drain-Source Bias Hot carrier Writing", *IEDM* 95, pp. 989-992.

Bude et al., "Secondary Electroon Flash—a High Performance, Low Power Flash Technology for 0.35 um and Below", *IEDM* 97, pp. 279-282.

Bude et al., "Modeling Nonequilibrium Hot Carrier Device Effects", *Conference of Insulator Specialists of Europe*, Sweden, Jun. 1997.

* cited by examiner

PROTECTIVE LAYER IN MEMORY DEVICE AND METHOD THEREFOR

FIELD OF THE INVENTION

The present invention relates to the manufacture of semiconductor products in general, and particularly to protection against damage to semiconductor circuits from effects of electromagnetic wave energy generated during an etch process.

BACKGROUND OF THE INVENTION

During the manufacture of semiconductor products, layers of material are laid down or grown. Some layers are then etched, to produce the desired shapes of transistors, metal lines, and other microelectronics devices. When the processing has finished, a functioning chip is produced. If the chip contains a memory array, it typically has a plurality of memory transistors that may be programmed or erased. For example, the memory transistors may be floating gate transistors, nitride read only memory (NROM) transistors, silicon oxide-nitride oxide-silicon (SONOS) transistors, and any other non-volatile memory metal oxide semiconductor (MOS) devices capable of storing charge. Unfortunately, the manufacturing process may have some undesirable side effects. For example, in MOS technology, the charging of active elements during the manufacturing process may alter the device's characteristics or even damage them.

Reference is now made to FIG. 1, which illustrates a typical cross-section of an MOS or complementary MOS (CMOS) transistor wafer. It is typically formed of a gate oxide 10 over which is a polysilicon element 12. On either side of the gate oxide 10 are field oxides 14 which are much thicker than the gate oxide 10. Typically, the polysilicon element 12 also spreads over the field oxides 14. A more advanced process may have trench isolation instead of field oxides, but the effects discussed hereinbelow are the same in such a case.

During manufacture, the field oxides 14 are first produced on a substrate 8, after which the gate oxides 10 are grown. A layer of polysilicon is laid over the oxides 10 and 14, and then etched to the desired shapes, such as by employing a shaped photoresist layer 15. The etching process typically involves placing a plasma 16, as is now explained.

The etching process may be carried out by many methods, however, plasma based processes such as plasma enhanced chemical vapor deposition (CVD) and reactive ion etching (RIE) are very common. Typically, energy for etching is generated by coupling radio frequency (RF) electromagnetic energy to a plasma 16. The RF energy may be supplied by an RF generator coupled to a power supply. In FIG. 1, the etching process involves placing plasma 16 between the transistor and a electrified plate 18 connected to a high voltage source, and electrically connecting a second electrified plate 20 to the substrate 8.

Plasma may generate ultraviolet (UV) photons. UV photons may also be generated during deposition of metal layers, such as in sputtering techniques. High energy electrons associated with the UV photons may charge the transistor. More specifically, since polysilicon is a conductive material, the polysilicon element 12 may become charged by the high energy photons. This is known as the "charging effect". The charging effect is not generally a problem in conventional floating gate transistors because the excess charge may be erased. However, it may degrade the gate oxide as is now explained.

The more charge the polysilicon element 12 attracts, the greater the voltage drop between the polysilicon element 12 and the substrate 8. If the voltage drop is high enough, it induces Fowler-Nordheim (F-N) tunneling of charge from the substrate 8 to the polysilicon element 12, via the gate oxide 10, as indicated by arrows 24. Since the field oxides 14 are quite thick, no F-N tunneling generally occurs through them. Unfortunately, F-N tunneling may cause breakdown of the gate oxide 10, especially if the gate oxide 10 is quite thin. It is appreciated that, once the gate oxide 10 has broken down, the transistor will not function.

Solutions are known for handling the gate oxide degradation problem of CMOS and floating gate transistors. The event of the F-N tunneling is a function of the size of the polysilicon element 12, the area of the gate oxide 10 and its thickness. As long as the area of polysilicon over the field oxides 14 is no larger than K times the area over the thin gate oxides 10 (where K, called the "antenna ratio", varies according to the specific manufacturing process), the F-N tunneling will not occur. Alternatively, the total charge passing through the oxide will be small enough not to cause breakdown of the oxide. Accordingly, the amount of F-N tunneling may be reduced by reducing the area of the field oxide relative to the area of the gate.

In NROM devices, similar to the CMOS and floating gate memory devices, the abovementioned charging effect may be reduced by various techniques, such as the reduction of the antenna ratio K and adding discharge devices along the poly lines. Such techniques are discussed in applicant/assignee's U.S. patent application Ser. No. 09/336,666, filed Jun. 18, 1999 and entitled "Method and Circuit for Minimizing the Charging Effect During Manufacture of Semiconductor Devices".

However, in NROM devices, yet another problem may occur, wherein excess charge may accumulate along the edges of word lines. The excess charge is not uniform, and increases the threshold voltage $V_t$ of the cell. The increase in threshold voltage being non-uniform across the device width, may degrade the reliability and endurance of the cell. In NROM cells, programmed bits in the charge-trapping nitride layer are generally erased by hot hole injection. However, hot hole injection may only erase charge next to the source/drain junctions. The charge along the word line edge, far from the source/drain junctions, may not generally be erased. It would therefore be desirable to prevent UV photon-induced charge effect in the word-line edges of NROM devices.

SUMMARY OF THE INVENTION

The present invention seeks to provide methods and apparatus for protecting against plasma-induced damage to semiconductor circuits. The invention may be used in any non-volatile memory device, particularly a memory device with a non-conducting charge layer. The invention will be described with reference to an NROM device, although it is understood that the invention is not limited to NROM devices.

In accordance with a preferred embodiment of the present invention, a protective layer is formed in the NROM device over a polycide structure (e.g., a word line). The protective layer may comprise an ultraviolet absorber, e.g., a nitride layer. Nitride is a good absorber of UV energy, and accordingly may prevent UV photons from the plasma etching from inducing stress in the polysilicon layer or gate stress in an oxide-nitride-oxide (ONO) layer. One preferred nitride comprises a thick silicon-rich silicon nitride alloy. Additionally or alternatively, the protective layer may comprise a layer of highly resistive undoped polysilicon.

There is thus provided in accordance with a preferred embodiment of the present invention a method for protecting a non-volatile memory device, the method including forming a non-volatile memory device including a polycide structure formed over a non-conducting charge trapping layer, and forming a protective layer over at least a portion of the polycide structure, the protective layer being adapted to absorb electromagnetic wave energy having a wavelength shorter than visible light.

There is also provided in accordance with a preferred embodiment of the present invention a non-volatile memory device including a polycide structure formed over a non-conducting charge trapping layer, and a protective layer formed over at least a portion of the polycide structure, the protective layer being adapted to absorb electromagnetic wave energy having a wavelength shorter than visible light.

In accordance with a preferred embodiment of the present invention the protective layer includes an ultraviolet absorber.

Further in accordance with a preferred embodiment of the present invention the protective layer includes a nitride layer.

Still further in accordance with a preferred embodiment of the present invention the nitride layer includes a silicon-rich silicon nitride alloy.

In accordance with a preferred embodiment of the present invention the nitride layer includes $Si_{3+x}N_4$, wherein x>0.

Further in accordance with a preferred embodiment of the present invention the nitride layer includes a hydrogenated silicon-rich silicon nitride alloy.

Still further in accordance with a preferred embodiment of the present invention the nitride layer includes an amorphous silicon-rich silicon nitride alloy.

In accordance with a preferred embodiment of the present invention the protective layer includes a nitride layer with a thickness of 50–1000 Å.

Further in accordance with a preferred embodiment of the present invention the protective layer includes a layer of resistive undoped polysilicon.

Still further in accordance with a preferred embodiment of the present invention the protective layer of undoped polysilicon includes a resistivity of at least 1 GΩ.

In accordance with a preferred embodiment of the present invention the protective layer of undoped polysilicon includes a thickness of 30–600 Å.

Further in accordance with a preferred embodiment of the present invention at least one additional layer is formed over the protective layer.

Still further in accordance with a preferred embodiment of the present invention the at least one additional layer includes at least one of a layer of undoped glass, a layer of doped glass, and a metal layer.

In accordance with a preferred embodiment of the present invention the polycide structure includes a polysilicon layer and a metal silicide film.

Further in accordance with a preferred embodiment of the present invention the polysilicon layer includes a polycrystalline silicon (polysilicon). The polysilicon layer may or may not be doped with a dopant.

Still further in accordance with a preferred embodiment of the present invention the metal silicide film includes at least one of a tungsten silicide film and a titanium silicide film.

In accordance with a preferred embodiment of the present invention the non-volatile memory device includes a nitride, read only memory (NROM) device, and the non-conducting charge trapping layer includes a nitride charge trapping layer.

BRIEF DESCRIPTION OF THE DRAWINGS

The present invention will be understood and appreciated more fully from the following detailed description taken in conjunction with the appended drawings in which:

FIGS. 3 and 4 are simplified cross-sectional illustrations of application of a protective layer over portions of the NROM device of FIG. 2, in accordance with a preferred embodiment of the present invention, wherein FIG. 3 is a cross-section along poly lines and FIG. 4 is a cross-section of word lines between bit lines.

DETAILED DESCRIPTION OF THE PRESENT INVENTION

Figure 1:
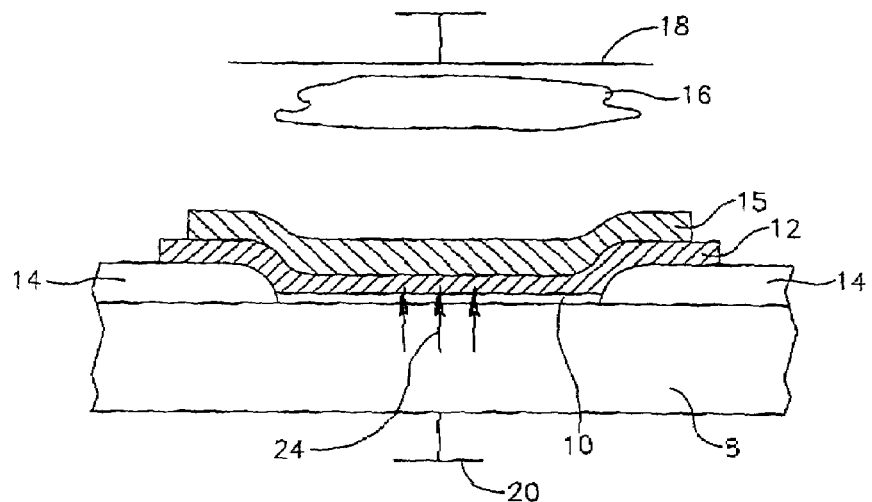
FIG. 1 is a schematic illustration of a prior art metal oxide semiconductor (MOS) transistor in a semiconductor chip during an etching operation.
Figure 2:
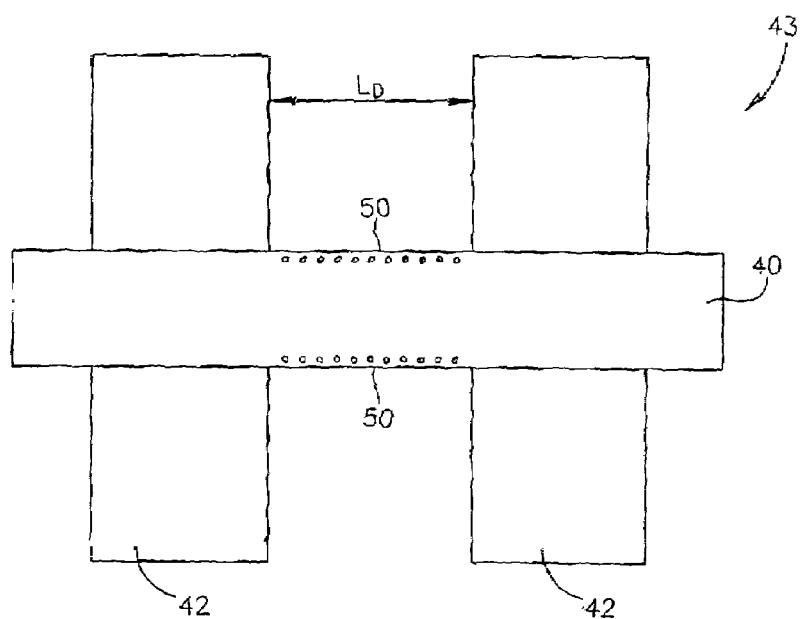
FIG. 2 is a simplified illustration of a charging effect in an NROM non-volatile memory device.

Reference is now made to FIG. 2, which illustrates a charging effect in an NROM non-volatile memory device 43, which includes one or more word lines (WL) 40 and bit lines (BL) 42. Bit lines 42 may be separated from each other by a distance $L_D$. During etching and/or sputtering processes, portions of device 43, such as but not limited to, edges 50 of word line 40, may accumulate charge (indicated by dots along edges 50 in FIG. 2) due to the deleterious charge effect mentioned hereinabove.

Figure 3:
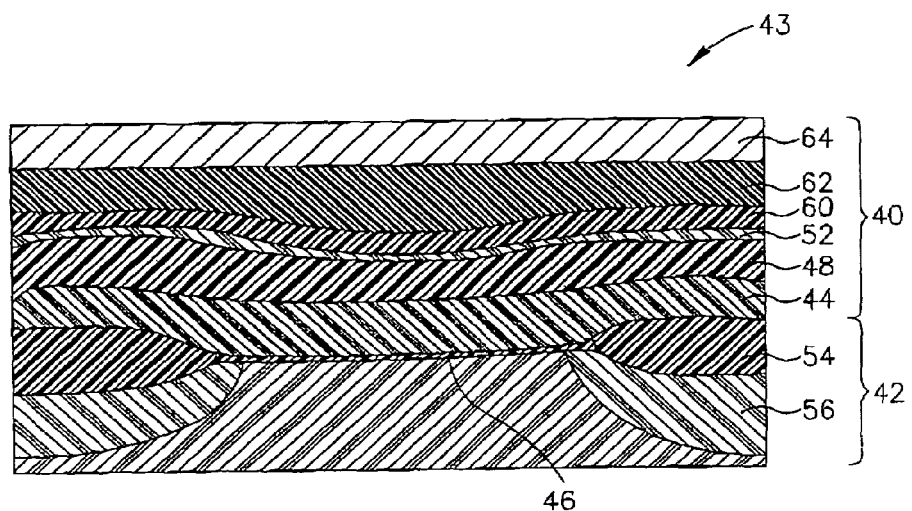
Figure 4:
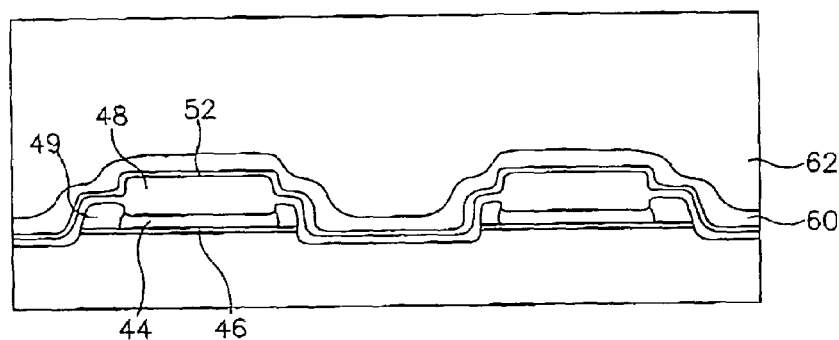

Reference is now made to FIGS. 3 and 4, which illustrate cross-sections of the NROM non-volatile memory device 43. WL 40 may comprise a polycide structure, comprising for example, a lower polysilicon layer 44 and an upper layer formed of a metal silicide film 48. Polysilicon layer 44 may comprise without limitation a polycrystalline silicon (polysilicon), which may or may not be doped with a dopant such as phosphorus, for example. Metal silicide film 48 may comprise without limitation a tungsten silicide film or a titanium silicide film, for example.

The polycide structure of polysilicon layer 44 and metal silicide film 48 may be formed over an ONO layer 46. ONO layer 46 is also referred to as a nitride charge trapping layer. As seen in FIG. 3, bit line 42 may include a BL oxide layer 54 and a BL junction 56.

Additional layers may be formed over polysilicon layer 44 and metal silicide film 48. Such layers may include, without limitation, a layer of undoped glass 60 (silicon dioxide), a layer of doped glass 62, and a metal layer 64. The doped glass layer 62 may comprise borophosphosilicate glass (BPSG), and phosphosilicate glass (PSG), for example. The additional layers may be grown, or deposited by physical deposition (e.g., sputtering) or formed by any other suitable technique, and are generally etched to their final dimensions and form by plasma etching. As mentioned hereinabove, high energy electrons from UV light photons generated by the sputtering and etching may cause charge to be accumulated in the edges 50.

In accordance with a preferred embodiment of the present invention, in order to prevent the charge effect, a protective layer 52 is applied over at least a portion of the polycide structure of polysilicon layer 44 and metal silicide film 48. The protective layer 52 may be applied prior to the formation of the additional layers 60 and 62. Alternatively, the protective layer 52 may be applied over additional layers 60 and 62, and prior to the formation of the metal layer 64, as seen in FIG. 3. The protective layer 52 has the property of absorbing electromagnetic wave energy, such as but not limited to UV light, and serves as a protective mask that may prevent high energy photons from reaching the polycide structure of polysilicon layer 44 and metal silicide film 48 while sputtering and etching the additional layers 60 and 62, or metal layer 64. In general, protective layer 52 may absorb electromagnetic wave energy having a wavelength shorter than visible light.

In accordance with a preferred embodiment of the present invention, the protective layer 52 comprises an ultraviolet absorber, e.g., a nitride layer. Nitride is a good absorber of UV energy, and accordingly may prevent UV photons from the sputtering or plasma etching from inducing stress in the polycide structure of polysilicon layer 44 and/or metal silicide film 48, or gate stress in the ONO layer 46. One preferred nitride comprises a silicon-rich silicon nitride alloy, such as $Si_{3+x}N_4$, wherein x>0. The silicon-rich silicon nitride alloy may be hydrogenated and/or amorphous. The nitride layer is preferably relatively very thick, such as without limitation, in the range of 50–1000 Å. The nitride layer may be formed using any suitable technique, such as but not limited to, a low pressure chemical vapor deposition technique (LPCVD).

Additionally or alternatively, the protective layer 52 may comprise a layer of highly resistive undoped polysilicon. The layer of undoped polysilicon may be deposited using any suitable technique, such as but not limited to, CVD methods. The undoped polysilicon layer is preferably relatively very thin, such as without limitation, in the range of 30–600 Å. The undoped polysilicon layer preferably has a high resistance, such as without limitation, at least 1 GΩ.

As seen in FIG. 4, if needed, there may be a spacer 49 between protective layer 52 and portions of polysilicon layer 44.

If the protective layer 52 has been formed over metal silicide film 48, the additional layers 60 and 62 may be formed over protective layer 52, such as but not limited to, by sputtering and etching. If the protective layer 52 has been formed over the additional layers 60 and 62, the metal layer 64 may be deposited or etched over protective layer 52, for example. The protective layer 52 may have a high electrical resistivity so as to prevent leakage from one contact to another contact (or from one via to another via) formed in the device 43. The protective layer 52 may thus prevent electrical stress and gate stress problems, as well as prevent leakage between contacts in device 43.

It will be appreciated by persons skilled in the art that the present invention is not limited by what has been particularly shown and described herein above. Rather the scope of the invention is defined by the claims that follow:

What is claimed is:

1. A method of protecting a non-volatile memory device, the method comprising:

forming a non-volatile memory device comprising a polycide structure formed over a non-conducting charge trapping layer; and forming a resistive protective layer over at least a portion of said polycide structure, said resistive protective layer adapted to persist on at least a portion of said polycide structure and to absorb electromagnetic wave energy having a wavelength shorter than visible light.

2. The method according to claim 1 wherein said forming said protective layer comprises forming an ultraviolet absorber.

3. The method according to claim 1 wherein said forming said protective layer comprises forming a nitride layer.

4. The method according to claim 3 wherein said forming said nitride layer comprises forming a silicon-rich silicon nitride alloy.

5. The method according to claim 4 wherein said forming said nitride layer comprises forming a nitride layer comprising $Si_{3+x}N_4$, wherein x>0.

6. The method according to claim 3 wherein said forming said nitride layer comprises forming a hydrogenated silicon-rich silicon nitride alloy.

7. The method according to claim 3 wherein said forming said nitride layer comprises forming an amorphous silicon-rich silicon nitride alloy.

8. The method according to claim 1 wherein said forming said protective layer comprises forming a nitride layer with a thickness of 50–1000 Å.

9. The method according to claim 1 wherein said forming said protective layer comprises forming a layer of resistive undoped polysilicon.

10. The method according to claim 9 wherein said forming said protective layer of undoped polysilicon comprises forming a layer with a resistivity of at least 1 GΩ.

11. The method according to claim 9 wherein said forming said protective layer of undoped polysilcon comprises forming a layer with a thickness of 30–600 Å.

12. The method according to claim 1 and further comprising forming at least one additional layer over said protective layer.

13. The method according to claim 12 wherein said forming said at least one additional layer comprises forming at least one of a layer of undoped glass, a layer of doped glass and a metal layer.

14. The method according to claim 12 and further comprising plasma etching said at least one additional layer with said protective layer masking at least a portion of said polycide structure.

15. The method according to claim 1 wherein said forming said non-volatile memory device comprises forming said non-volatile memory device with a polycide structure comprising a polysilicon layer and a metal silicide film.

* * * * *

UNITED STATES PATENT AND TRADEMARK OFFICE
CERTIFICATE OF CORRECTION

PATENT NO.         : 7,098,107 B2                                         Page 1 of 1
APPLICATION NO.    : 09/988122
DATED              : August 29, 2006
INVENTOR(S)        : Ilan Bloom et al.

It is certified that error appears in the above-identified patent and that said Letters Patent is hereby corrected as shown below:

On The Title Page Item (73) should read: --Assignee: Saifun Semiconductors Ltd., Netanya (IL)--

Signed and Sealed this

Third Day of June, 2008

JON W. DUDAS
*Director of the United States Patent and Trademark Office*